United States Patent
Nishiyama (10) Patent No.: US 10,617,051 B2
(45) Date of Patent: Apr. 7, 2020

(54) COMPONENT MOUNTER AND COMPONENT MOUNTING METHOD

(71) Applicant: FUJI CORPORATION, Chiryu-shi (JP)

(72) Inventor: Satoru Nishiyama, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 161 days.

(21) Appl. No.: 15/553,110

(22) PCT Filed: Feb. 24, 2015

(86) PCT No.: PCT/JP2015/055305
§ 371 (c)(1),
(2) Date: Aug. 23, 2017

(87) PCT Pub. No.: WO2016/135871
PCT Pub. Date: Sep. 1, 2016

(65) Prior Publication Data
US 2018/0054930 A1    Feb. 22, 2018

(51) Int. Cl.
*H05K 13/04*  (2006.01)
(52) U.S. Cl.
CPC ....... *H05K 13/0413* (2013.01); *H05K 13/041* (2018.08)
(58) Field of Classification Search
CPC ............. H05K 13/0408; H05K 13/041; H05K 13/0413
See application file for complete search history.

(56) References Cited

U.S. PATENT DOCUMENTS

| 9,452,897 | B2 * | 9/2016 | Nishiyama | ......... | H05K 13/0413 |
| 2015/0237773 | A1 * | 8/2015 | Nishiyama | ......... | H05K 13/0404 |
| | | | | | 29/743 |

(Continued)

FOREIGN PATENT DOCUMENTS

| JP | 2004/039818 A | 2/2004 |
| JP | 2013/19177 A | 9/2013 |

OTHER PUBLICATIONS

International Search Report dated May 19, 2015 in PCT/JP2015/055305 filed Feb. 24, 2015.

*Primary Examiner* — Minh N Trinh
(74) *Attorney, Agent, or Firm* — Oblon, McClelland, Maier & Neustadt, L.L.P.

(57) ABSTRACT

An interference-prevention Q-axis rotation height position is set as a height position at an intermediate point of raising operation of suction nozzle, and a height position at which the component does not interfere with central protruding member on the lower surface of rotary head. Performed is control of large component interference prevention mode, in which, after picking up the component using suction nozzle at a component pickup height position that is the lower limit height position of lowering operation, the direction of the component is corrected by raising the suction nozzle to the interference-prevention Q-axis rotation height position that is a height position at an intermediate point of raising operation of suction nozzle and then rotating the component held by suction nozzle by Q-axis driving operation, and subsequently raising suction nozzle to a maximum height position of the raising operation, and then moving rotary head in the XY direction.

4 Claims, 5 Drawing Sheets

(56) References Cited

U.S. PATENT DOCUMENTS

2018/0035579 A1* 2/2018 Nishiyama ......... H05K 13/0408
2018/0054930 A1* 2/2018 Nishiyama ......... H05K 13/0408
2018/0153061 A1* 5/2018 Iisaka ................ H05K 13/0409

* cited by examiner

COMPONENT MOUNTER AND COMPONENT MOUNTING METHOD

TECHNICAL FIELD

The present invention relates to a component mounter that includes a rotary head that holds multiple suction nozzles in a lowerable manner at predetermined intervals in a circumferential direction of the rotary head, and a component mounting method.

BACKGROUND ART

For example, as described in PTL 1 (JP-A-2004-39818), in a rotating head (rotary head) type component mounting device, multiple nozzle holders are provided on a rotating head in a lowerable manner at predetermined intervals in a circumferential direction of the rotating head, each suction nozzle is held on each nozzle holder pointing downward, the rotating head is rotated around an R axis (vertical axis) by an R-axis driving mechanism, the multiple nozzle holders are revolved in the circumferential direction of the rotating head together with the suction nozzles held by the multiple nozzle holders, and pickup of a component is performed by lowering one nozzle holder by a Z-axis driving mechanism at a predetermined position on the revolving path, then, after raising the suction nozzle that performed component pickup operation to a component transport height, each nozzle holder is rotated around a central axis line (Q axis) by a Q-axis driving mechanism, such that a direction (angle) of each component held by each suction nozzle held by each nozzle holder is corrected. Note that, the Q axis is also referred to as the θ axis.

With a component mounter with this type of rotary head, as disclosed in patent literature 2 (JP-A-2013-191771), an imaging device for imaging a component held by a suction nozzle from the side is arranged near the rotary head, and a cylindrical background member that acts as the background to the side image of the component imaged by the imaging device is provided protruding downwards from a central portion of a lower surface of the rotary head.

CITATION LIST

Patent Literature

Patent literature 1: JP-A-2004-39818
Patent literature 2: JP-A-2013-191771

SUMMARY OF INVENTION

Technical Problem

With items with the above conventional configurations, because Q-axis rotation operation for correcting the direction (angle) of the component is performed by rotating the suction nozzle using a Q-axis driving mechanism after the suction nozzle has been raised to the original component transport height following component pickup operation, the height position of the component held by the suction nozzle during Q-axis rotation operation is at the same level as the height of the cylindrical background member on the central portion of the lower surface of the rotary head. With this height position relationship, when a large component is picked up by the suction nozzle, because there is a possibility that the component will interfere with the cylindrical background member on the central portion of the lower surface of the rotary head during Q-axis rotation operation, the maximum size of component to be picked up by the suction nozzle is restricted to a size where interference will not occur with the cylindrical background member during Q-axis rotation operation, and in a case of mounting a component that exceeds this maximum size, it is necessary to change to a rotary head for which interference between the cylindrical background member and the component will not occur, causing lower productivity, increasing the number of types of rotary heads that must be prepared, and thereby increasing costs.

Therefore, to solve the above problems, an object of the present invention is to provide a component mounter and component mounting method that increase the maximum size of a component that can be mounted with a suction nozzle of a rotary head.

Solution to Problem

To solve the above problems, the prevent invention includes: multiple suction nozzles configured to pick up a component, the suction nozzles being provided on a rotary head in a lowerable manner at predetermined intervals in a circumferential direction of the rotary head; an R-axis driving mechanism configured to revolve the multiple suction nozzles in a circumferential direction of the rotary head by rotating the rotary head around an R-axis; a Q-axis driving mechanism configured to correct a direction of the component that is being held by the suction nozzle by rotating the component by performing Q-axis rotation operation of rotating the suction nozzle around its own center axis; a Z-axis driving mechanism configured to raise and lower the suction nozzle; a head moving mechanism configured to move the rotary head; a central protruding member provided protruding downwards on a central portion of a lower surface of the rotary head; and a control device configured to control operations of the R-axis driving mechanism, the Q-axis driving mechanism, and the Z-axis driving mechanism, the control device being provided with a function to perform control of a large component interference prevention mode, in which, after lowering the suction nozzle using the Z-axis driving mechanism to a component pickup height position that is a lower limit height position of lowering operation of the suction nozzle and picking up the component with the suction nozzle, raising the suction nozzle to an interference-prevention Q-axis rotation height position that is a height position at an intermediate point of raising operation of the suction nozzle, then rotating the component held by the suction nozzle by Q-axis driving operation of the Q-axis driving mechanism so as to correct the direction of the component, and subsequently raising the suction nozzle to a component transport height position that is a maximum height position of the raising operation, and then moving the rotary head using the head moving mechanism, wherein the interference-prevention Q-axis rotation height position is set as a height position at which interference does not occur between the picked up component and the central protruding member even when a large component is picked up by the suction nozzle and rotated.

That is, with the present invention, because the interference-prevention Q-axis rotation height position, which is the height position at which Q-axis rotation operation is performed after completion of component pickup operation, is a height position at an intermediate point of raising operation of the suction nozzle, and is a height position at which the component does not interfere with the central protruding member on the lower surface of the rotary head even if a large component is picked up by the suction nozzle and rotated, it is possible to pick up a large component with the suction nozzle and perform Q-axis rotation operation even for a large component for which interference may occur with the central protruding member if Q-axis rotation operation is performed at the component transport height, which is a maximum height position of raising operation of the suction nozzle, and the maximum size of a component that can be mounted by the suction nozzle is increased.

With the present invention, even if the central protruding member is larger than a conventional central protruding member, because interference between the central protruding member and the component is prevented by performing Q-axis rotation operation at the interference-prevention Q-axis rotation height position, the central protruding member can be made larger. The central protruding member may be one of a background member, a light reflecting member, or an illumination source that is used when imaging the component picked up by the suction nozzle from the side using an imaging device, and with respect to the maximum size of component picked up by the suction nozzle, the size of the central protruding member of a background member or the like may be increased to a size required for performing stable imaging.

Note that, there are cases in which interference between the central protruding member and the component does not occur even if Q-axis rotation operation is performed at the component transport height position that is the maximum height position of the suction nozzle during raising operation, such as when the component picked up by the suction nozzle is small, or due to the pickup orientation of the component. Thus, in such cases, it is not necessary to perform Q-axis rotation operation at the interference-prevention Q-axis rotation height position.

Considering the above, the control device may determine whether it is necessary to prevent interference with the central protruding member based on one or both of a size of the component picked up by the suction nozzle or a pickup orientation of the component, and, in a case in which it is determined that it is necessary to prevent interference with the central protruding member, perform control of the large component interference prevention mode, and, in a case in which it is determined that it is not necessary to prevent interference with the central protruding member, perform control of a normal mode, in which, after component pickup operation, the suction nozzle is raised to the component transport height position by the Z-axis driving mechanism and then Q-axis rotation operation is performed by the Q-axis driving mechanism. By doing this, in cases in which a small component for which prevention of interference with the central protruding member is not necessary, or in cases in which a sufficient gap can be maintained in a horizontal direction between the central protruding member and the component, it is possible to quickly raise the suction nozzle after component pickup operation to the component transport position, which is the maximum height position of raising operation of the suction nozzle, and then perform Q-axis rotation operation, thus shortening the cycle time.

Note that, with the present invention, an operator may switch to and from large component interference prevention mode and normal mode manually, or large component interference prevention mode may be performed for all components picked up by a suction nozzle, regardless of size, and Q-axis rotation operation may be performed at the interference-prevention Q-axis rotation height position even in a case of picking up a small component for which it is not necessary to prevent interference with the central protruding member.

With the present invention, the Q-axis driving mechanism may be configured to rotate the multiple suction nozzles simultaneously, and, control may be performed such that, in a case of performing control of the large component interference prevention mode, pick up of a component is performed with only one of the multiple suction nozzles, and a component is not picked up with the other suction nozzles. By doing this, it is possible to reliably prevent interference between components being held on different multiple suction nozzles. Note that, with the present invention, in a case of performing control of large component interference prevention mode, it goes without saying that pickup may be performed by two or more suction nozzles at a nozzle interval for which interference does not arise between the components during Q-axis rotation operation.

DESCRIPTION OF EMBODIMENTS

An embodiment of the invention is described below. First, the configuration of rotary head 11 of the component mounter is described using FIGS. 1 to 3.

Figure 2:
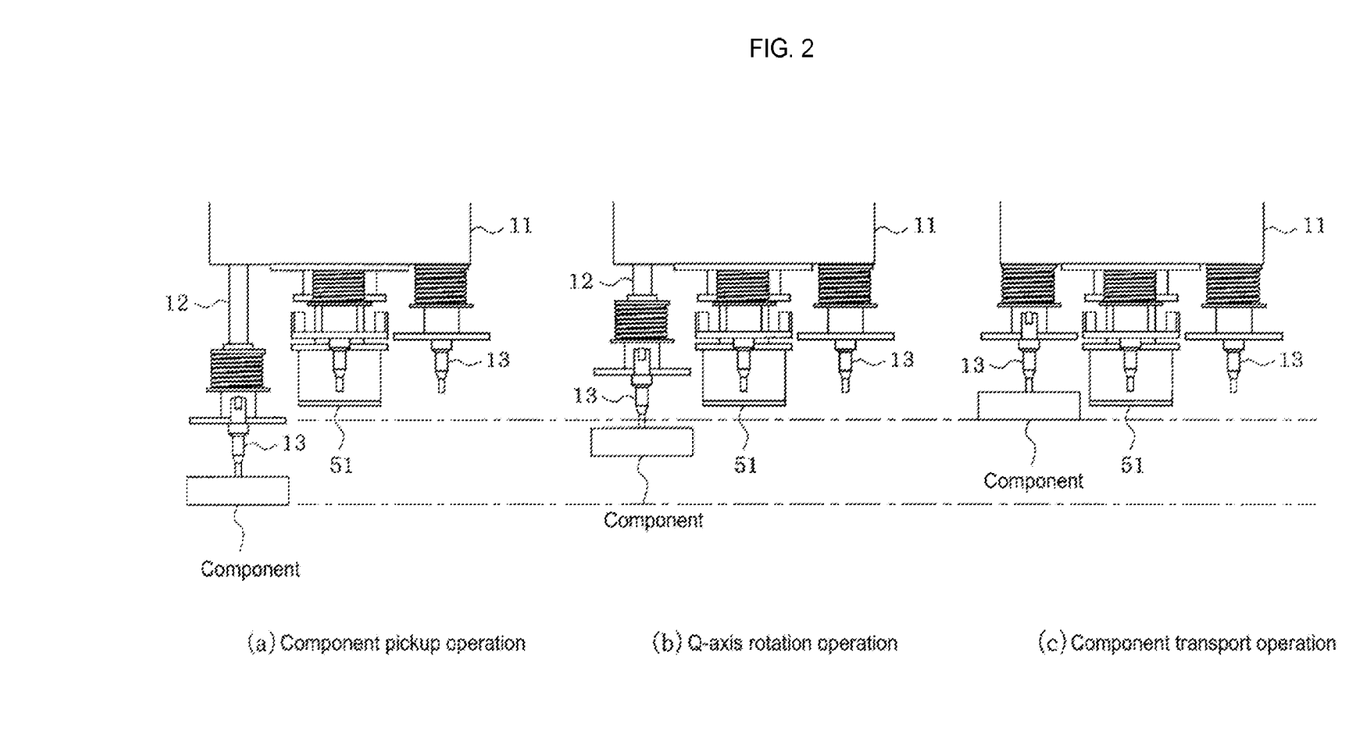
FIG. 2 illustrates operation of control of large component interference prevention mode, with FIG. 2(a) being a front view showing component pickup operation, FIG. 2(b) being a front view showing Q-axis rotation operation, and FIG. 2(c) being a front view showing component transport operation.

Multiple nozzle holders 12 are lowerable supported on rotary head 11 at a predetermined interval in a circumferential direction, and suction nozzles 13 that each pick up a component are exchangeably supported facing downwards on each nozzle holder 12. Note that, only two nozzle holders 12 (suction nozzles 13) are shown in FIG. 2, other nozzle holders 12 (suction nozzles 13) are omitted.

Head moving mechanism 15 that moves rotary head 11 in XY directions is an XY robot provided with X-axis slide 17 that is slid by X-axis ball screw 1 in an X-axis direction (a direction perpendicular to the surface of the page of FIG. 1) that is a board conveyance direction, and Y-axis slide 18 that is moved by a Y-axis ball screw (not shown) in a Y-axis direction that is perpendicular to the X-axis direction. X-axis slide 17 is supported on X-axis guide rails 19 provided on Y-axis slide 18 so as to be slidable in the X-axis direction, and Y-axis slide 18 is supported on Y-axis guide rails (not shown) provided on the main body side of the component mounter so as to be slidable in the Y-axis direction.

Figure 1:
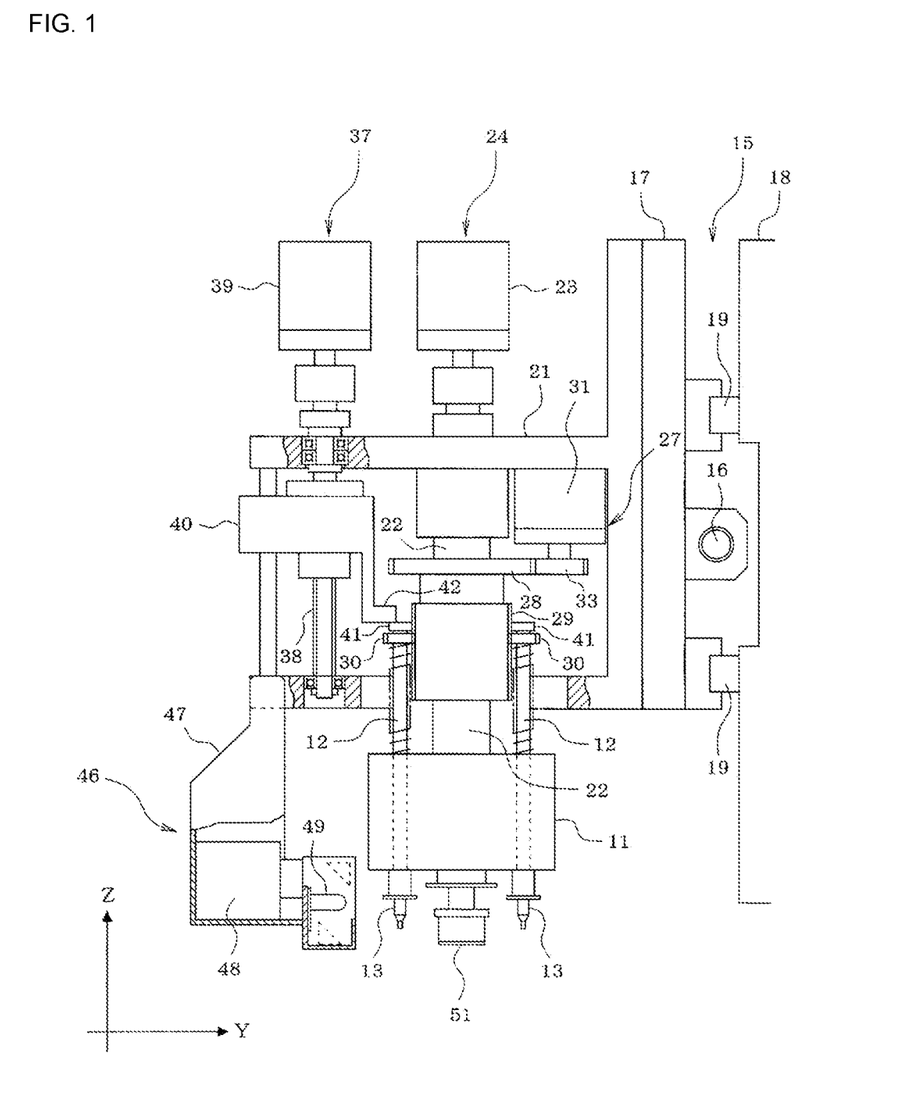
FIG. 1 is a front view showing the configuration of a rotary head of a component mounter of an embodiment of the present invention.

Support frame 21 of rotary head 11 is detachably attached to X-axis slide 17. Rotary head 11 is engaged with a lower end of R axis 22 (also referred to as an index axis) that extends in a vertical direction, and the upper section of R axis 22 is supported on support frame 21 so as to be rotatable. R axis 22 is rotated by R-axis motor 23 that is fixed to the support frame 21 side. By rotating rotary head 11 around R axis 22 at the center by rotating R axis 22, the multiple nozzle holders 12 supported on rotary head 11 revolve together with the multiple suction nozzles 13 in a circumferential direction of rotary head 11. R-axis driving mechanism 24 is configured from R-axis motor 23 and R-axis 22 and so on.

Two levels in the vertical direction of Q-axis gears 28 and 29 of Q-axis driving mechanism 27 are rotatably inserted into R axis 22; gear 30 that engages with an upper end of each nozzle holder 12 is engaged with lower level Q-axis gear 29. Gear 33 connected to Q-axis motor 31 fixed to the support frame 21 side is engaged with upper level Q-axis gear 28; by the rotation of gear 33 of Q-axis motor 31, Q-axis gears 28 and 29 rotate together, such that each gear 30 engaged with lower level Q-axis gear 29 rotates, causing each nozzle holder 12 to rotate about its own center axis (Q axis), thereby correcting the direction (angle) of each component picked up by each suction nozzle supported on each nozzle holder 12. Note that, the Q axis is also referred to as the θ axis.

Further, Z-axis driving mechanism 37 that individually lowers nozzle holders 12 is provided to a side of R-axis driving mechanism, and the configuration is such that nozzle holders 12 are individually lowered at a specified position on the revolving path of nozzle holders 12 in order to lower the suction nozzle 13 supported on the nozzle holder 12. Z-axis driving mechanism 37 may be provided at only one location on the circumference of rotary head 11, or may be provided at two or more locations.

Z-axis driving mechanism 37 uses Z-axis motor 39 to rotate Z-axis ball screw 38 that is rotatably supported on the support frame 21 side to move Z-axis slide 40 in a vertical direction, thereby engaging (contacting) engaging member 42 of Z-axis slide 40 into upper end flange 41 of nozzle holder 12 from above, such that nozzle holder 12 moves vertically. In this case, by each nozzle holder 12 being biased upwards by spring 43 attached to each nozzle holder 12, upper end flange 41 of each nozzle holder 12 is supported in a state engaged (contacted) from below by engaging member 42 of Z-axis slide 40, and as engaging member 42 of Z-axis slide 40 is raised, the nozzle holder 12 is raised due to the pushing force of spring 43.

Also, imaging device 46 that images a component picked up by suction nozzle 13 from the side is arranged on a side of rotary head 11. Imaging device 46 is configured from items such as illumination sources 49 and camera 48 fixed to support frame 21 via holder 47.

Corresponding to this, central protruding member 51 that protrudes downwards is provided on a central portion of a lower surface of rotary head 11. Central protruding member 51 is one of a background member, a light reflecting member, or an illumination source that is used when imaging the component picked up by suction nozzle 13 from the side using camera 48. The height position of the lower end of central protruding member 51 is set at a height position at which central protruding member 51 does not interfere with the component and so on when lowering suction nozzle 13 to pick up a component.

Figure 4:
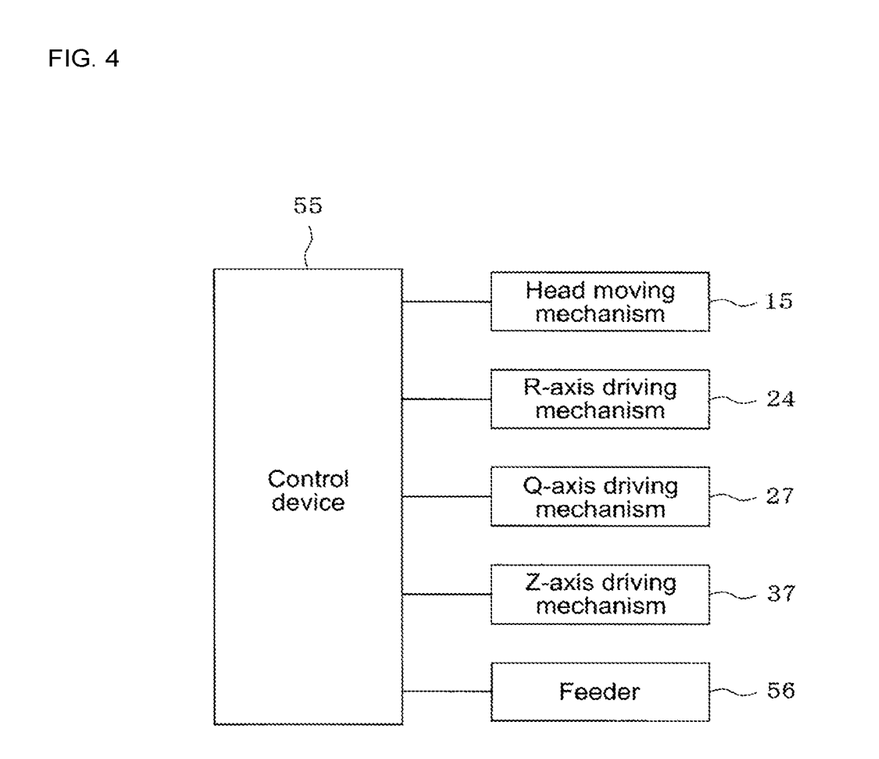
FIG. 4 is a block diagram showing the configuration of control items of the component mounter.

Control device 55 (refer to FIG. 4) of the component mounter controls operation of R-axis driving mechanism 24, Q-axis driving mechanism 27, and Z-axis driving mechanism 37, so as to pick up a component supplied from feeder 56 (refer to FIG. 4) using suction nozzle 13 and mount the component on a circuit board. Here, the direction (angle) of each component picked up by each suction nozzle 13 held on each nozzle holder 12 is corrected by rotating each nozzle holder 12 around its own center axis (Q axis) using Q-axis driving mechanism 27 after performing component pickup operation.

Figure 3:
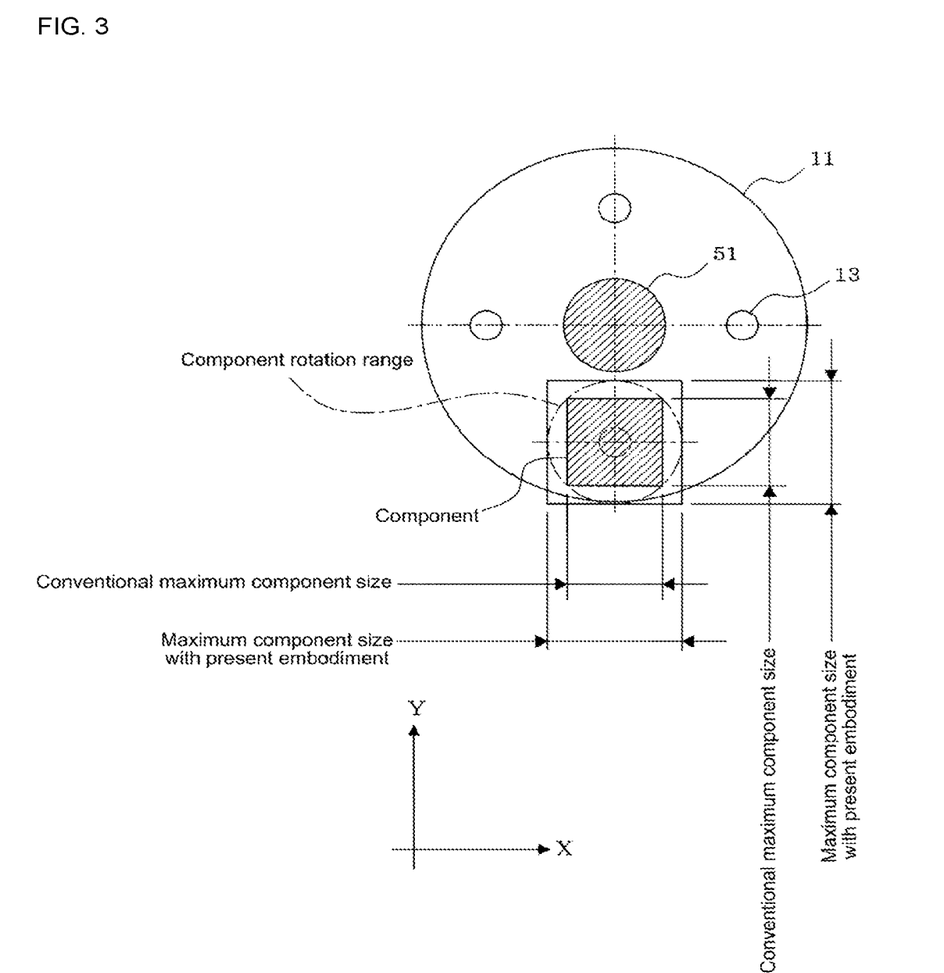
FIG. 3 is a bottom view of the rotary head illustrating the maximum size component that can be picked up by a suction nozzle by the embodiment compared to the conventional maximum size.

With a conventional configuration, because Q-axis rotation operation for correcting the direction of the component is performed by rotating suction nozzle 13 using Q-axis driving mechanism 27 after the suction nozzle 13 has been raised to the component transport height, which is a maximum height position of the raising operation, following component pickup operation, the height position of the component held by suction nozzle 13 during Q-axis rotation operation is at the same level as the height of central protruding member 51 of the lower surface of rotary head 11. With this height position relationship, when a large component is picked up by suction nozzle 13, because there is a possibility that the component will interfere with central protruding member 51 of the lower surface of rotary head 11 during Q-axis rotation operation, as shown in FIG. 3, the maximum size of component to be picked up by suction nozzle 13 is restricted to a size where interference will not occur with central protruding member 51 during Q-axis rotation operation, and in a case of mounting a component that exceeds this maximum size, it is necessary to change to a rotary head 11 for which interference between central protruding member 51 and the component will not occur, causing lower productivity, increasing the number of types of rotary heads 11 that must be prepared, and thereby increasing costs.

Thus, with the present embodiment, as shown in FIG. 2, the interference-prevention Q-axis rotation height position, which is the height position at which Q-axis rotation operation is performed after completion of component pickup operation, is a height position at an intermediate point of raising operation of suction nozzle 13, and is a height position at which the component does not interfere with central protruding member 51 on the lower surface of rotary head 11 even if a large component is picked up by suction nozzle 13 and rotated. Also, control device 55 of the component mounter is provided with a function that performs control of large component interference prevention mode, in which, after picking up the component using suction nozzle 13, as shown in FIG. 2(a), by lowering suction nozzle 13 using Z-axis driving mechanism 37 to a component pickup height position that is the lower limit height position of lowering operation, corrects the direction of the component by, as shown in FIG. 2(b), raising suction nozzle 13 to the interference-prevention Q-axis rotation height position that is a height position at an intermediate point of raising operation of suction nozzle 13 and then rotating the component held by suction nozzle 13 by Q-axis driving operation of Q-axis driving mechanism 27, and subsequently, as shown in FIG. 2(c), raises suction nozzle 13 to a component transport height position that is a maximum height position of the raising operation, and then moves rotary head 11 in the XY direction using head moving mechanism 15.

In the present embodiment, considering the fact that Q-axis driving mechanism 27 is configured to simultaneously rotate multiple suction nozzles 13 supported on rotary head 11, when performing control of the large component interference prevention mode, control is performed such that pick up of a component is performed with only one of the multiple suction nozzles 13, and a component is not picked up with the other suction nozzles 13. By doing this, it is possible to reliably prevent interference between components being held on different multiple suction nozzles 13.

Note that, with the present invention, in a case of performing control of large component interference prevention mode, it goes without saying that pickup may be performed by two or more suction nozzles 13 at a nozzle interval for which interference does not arise between the components during Q-axis rotation operation.

In the present embodiment, settings are specified such that rotary head 11 passes above the imaging area on the way to being moved above the circuit board, and control device 55 of the component mounter, when rotary head 11 passes above the imaging area, uses a camera (not shown) to image the component picked up by suction nozzle 13 from below, acquires a lower surface image of the component, processes the image, calculates an angle deviation and position deviation of the pickup position of the component with respect to suction nozzle 13, and corrects the angle deviation and position deviation of the component when mounting the component.

Note that, there are cases in which interference between central protruding member 51 and the component does not occur even if Q-axis rotation operation is performed at the component transport height position that is the maximum height position of suction nozzle 13 during raising operation, such as when the component picked up by suction nozzle 13 is small, or due to the pickup orientation of the component. Thus, in such cases, it is not necessary to perform Q-axis rotation operation at the interference-prevention Q-axis rotation height position.

Figure 5:
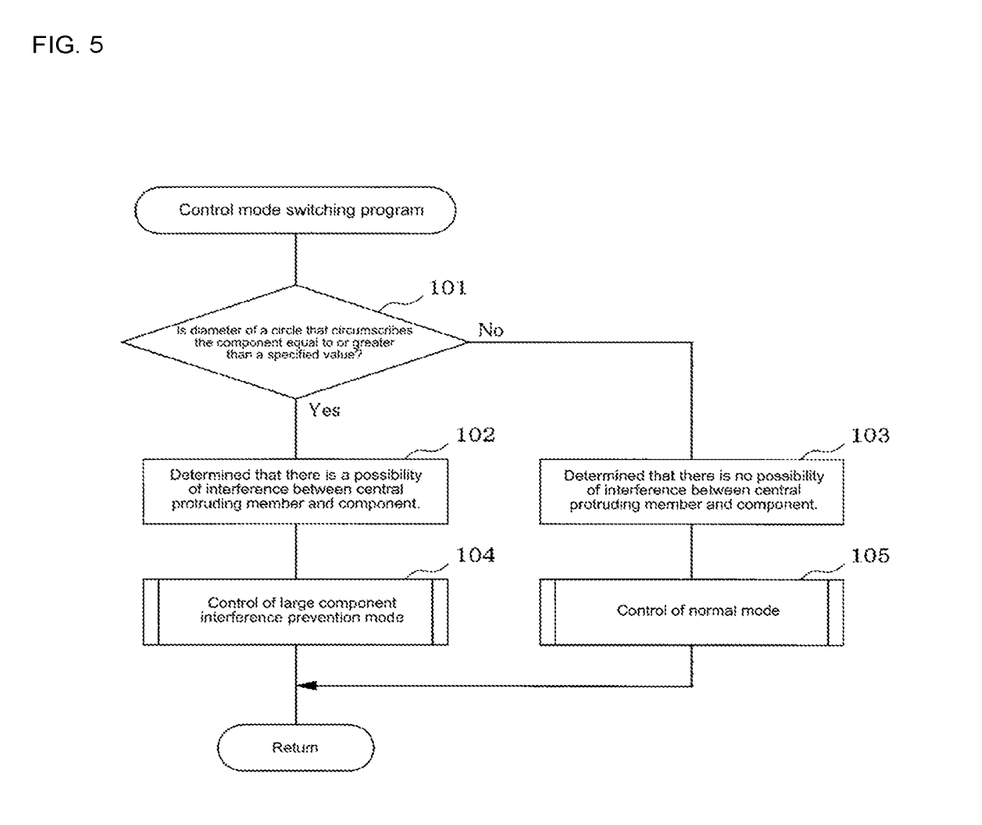
FIG. 5 is a flowchart showing the processing flow of a control mode switching program.

Considering this point, in the present embodiment, control device 55 of the component mounter, by performing the control mode switching program of FIG. 5, determines whether it is necessary to prevent interference with central protruding member 51 based on one or both of a size of the component picked up by suction nozzle 13 or a pickup orientation of the component, and, in a case in which it is determined that it is necessary to prevent interference with central protruding member 51 (a case in which interference may occur), performs control of the large component interference prevention mode, and, in a case in which it is determined that it is not necessary to prevent interference with central protruding member 51 (a case in which there is no possibility of interference), performs control of a normal mode, in which, after component pickup operation, suction nozzle 13 is raised to the component transport height position by Z-axis driving mechanism 37 and then Q-axis rotation operation is performed by Q-axis driving mechanism 27. Below, processing of the control mode switching program of FIG. 5 is described.

The control mode switching program of FIG. 5 is performed by control device 55 of the component mounter before starting component pickup operation. When the program is started, first, in step 101, it is determined whether there is a possibility of interference between central protruding member 51 and the component by determining whether the diameter dimension of a circle that circumscribes the component is equal to or greater than a specified value, thus using the the diameter dimension of the circle that circumscribes the component as a indicator of the size of the component picked up by suction nozzle 13, and based on this result, if it is determined that the diameter dimension of a circle that circumscribes the component is equal to or greater than the specified value, processing continues to step 102, it is determined that there is a possibility of interference between central protruding member 51 and the component (it is necessary to prevent interference between central protruding member 51 and the component), processing continues to step 104 and control of large component interference prevention mode is performed.

Note that, even if the sizes of the components picked up by suction nozzle 13 are the same, because the gap between the component and central protruding member 51 in the horizontal direction changes based on the pickup orientation of the component, when evaluating the size of the component picked up by suction nozzle 13, it is desirable to consider the pickup orientation of the component when evaluating the size of the picked up component in the horizontal direction, and determine the possibility of interference between central protruding member 51 and the component based on this.

On the other hand, in step 101 above, if it is determined that the diameter dimension of the circle that circumscribes the component is less than the specified value, processing continues to step 103, it is determined that there is no possibility of interference between central protruding member 51 and the component (it is not necessary to prevent interference between central protruding member 51 and the component), processing continues to step 105 and control of the normal mode is performed. By doing this, in cases in which a small component for which prevention of interference with central protruding member 51 is not necessary, or in cases in which a sufficient gap can be maintained in a horizontal direction between central protruding member 51 and the component, it is possible to quickly raise suction nozzle 13 after component pickup operation to the component transport position, which is the maximum height position of raising operation of the suction nozzle, and then perform Q-axis rotation operation, thus shortening the cycle time.

Note that, an indicator of the size of the component picked up by suction nozzle 13 is not limited to a circle that circumscribes the component, for example, a dimension of the longest diagonal line among diagonals of the component, or a dimension of the longest of the width (dimension in the X-axis direction) and the length (dimension in the Y-axis direction), may be used.

Note that, with the present invention, an operator may switch to and from large component interference prevention mode and normal mode manually, or large component interference prevention mode may be performed for all components picked up by a suction nozzle 13, regardless of size, and Q-axis rotation operation may be performed at the interference-prevention Q-axis rotation height position even in a case of picking up a small component for which it is not necessary to prevent interference with central protruding member 51.

According to the present embodiment described above, with control of large component interference prevention mode, because the interference-prevention Q-axis rotation height position, which is the height position at which Q-axis rotation operation is performed after completion of component pickup operation, is a height position at an intermediate point of raising operation of suction nozzle 13, and is a height position at which the component does not interfere with central protruding member 51 on the lower surface of rotary head 11 even if a large component is picked up by suction nozzle 13 and rotated, it is possible to pick up a large component with suction nozzle 13 and perform Q-axis rotation operation even for a large component for which interference may occur with central protruding member 51 if Q-axis rotation operation is performed at the component transport height, which is a maximum height position of raising operation of suction nozzle 13. By this, it is possible to mount larger components without changing rotary head 11, thus improving productivity and decreasing the number of types of rotary heads 11 to prepare, thereby reducing costs.

Also, as the maximum size of the component picked up by suction nozzle 13 increases, it is desirable to increase the size of central protruding member 51 (background member, light reflecting member, illumination source) used when imaging the component from the side using camera 48. For this point, with the present embodiment, even if central protruding member 51 is larger than a conventional central protruding member, because interference between central protruding member 51 and the component is prevented by performing Q-axis rotation operation at the interference-prevention Q-axis rotation height position, the size of central protruding member 51, such as a background member, can be made larger, which has the advantage of increasing the size to that necessary for stable imaging.

Note that, Q-axis driving mechanism 27 of the above embodiment is configured to rotate multiple suction nozzles 13 simultaneously, but a Q-axis driving mechanism may be provided for each suction nozzle 13, and each suction nozzle 13 may be rotated independently.

Further, the the present invention is not limited to the above embodiment and it goes without saying that various embodiments with changes that do not extend beyond the scope of the invention are possible, such as that suitable changes may be made to the configuration of R-axis driving mechanism 24, Q-axis driving mechanism 27, Z-axis driving mechanism 37, and head moving mechanism 15.

REFERENCE SIGNS LIST

11: rotary head; 12: nozzle holder; 13: suction nozzle; 15: head moving mechanism; 16: X-axis ball screw; 17: X-axis slide; 18: Y-axis slide; 19: X-axis guide rail; 22: R axis; 23: R-axis motor; 24: R-axis driving mechanism; 27: Q-axis driving mechanism; 28, 29: Q-axis gear; 31: Q-axis motor; 37: Z-axis driving mechanism; 38: Z-axis ball screw; 39: Z-axis motor; 40: Z-axis slide; 43: spring; 46: imaging device; 48: camera; 49: illumination source; 51: central protruding member; 55: control device; 56: feeder

The invention claimed is:

1. A component mounter comprising:
a rotary head rotatable around an R axis that extends in a vertical direction;
multiple suction nozzles configured to pick up a component, the suction nozzles being provided on the rotary head in a lowerable manner at predetermined intervals in a circumferential direction of the rotary head;
an R-axis driving mechanism configured to revolve the multiple suction nozzles in a circumferential direction of the rotary head by rotating the rotary head around the R-axis;
a Q-axis driving mechanism configured to correct a direction of the component that is being held by one of the suction nozzles by rotating the component by performing Q-axis rotation operation of rotating the one of the suction nozzles around a center axis of the one of the suction nozzles;
a Z-axis driving mechanism configured to raise and lower the one of the suction nozzles;
a head moving mechanism configured to move the rotary head;
a central protruding member provided protruding downwards on a central portion of a lower surface of the rotary head; and
a control device configured to control operations of the R-axis driving mechanism, the Q-axis driving mechanism, and the Z-axis driving mechanism, the control device being provided with a function to perform control of a large component interference prevention mode, in which, after lowering the one of the suction nozzles using the Z-axis driving mechanism to a component pickup height position that is a lower limit height position of lowering operation of the one of the suction nozzles and picking up the component with the suction nozzle, raising the one of the suction nozzles to an interference-prevention Q-axis rotation height position that is a height position at an intermediate point of raising operation of the one of the suction nozzles, then rotating the component held by the one of the suction nozzles by Q-axis driving operation of the Q-axis driving mechanism so as to correct the direction of the component, and subsequently raising the one of the suction nozzles to a component transport height position that is a maximum height position of the raising operation, and then moving the rotary head using the head moving mechanism,
wherein
the interference-prevention Q-axis rotation height position is set as a height position at which interference does not occur between the picked up component and the central protruding member even when another larger size component is picked up by the one of the suction nozzles and rotated.

2. The component mounter according to claim 1, wherein the central protruding member is one of a background member, a light reflecting member, or an illumination source that is used when imaging the component picked up by the one of the suction nozzles from the side using an imaging device.

3. The component mounter according to claim 1, wherein the control device determines whether it is necessary to prevent interference with the central protruding member based on at least one of a size of the component picked up by the one of the suction nozzles or a pickup orientation of the component, and, in a case in which it is determined that it is necessary to prevent interference with the central protruding member, performs control of the large component interference prevention mode, and, in a case in which it is determined that it is not necessary to prevent interference with the central protruding member, performs control of a normal mode, in which, after component pickup operation, the one of the suction nozzles is raised to the component transport height position by the Z-axis driving mechanism and then Q-axis rotation operation is performed by the Q-axis driving mechanism.

4. The component mounter according to claim 1, wherein the Q-axis driving mechanism is configured to rotate the multiple suction nozzles simultaneously, and the control device is configured to, in a case of performing control of the large component interference prevention mode, pick up a component with only one of the multiple suction nozzles, and to not pick up a component with the other suction nozzles.

* * * * *